US012702041B2

(12) United States Patent
Matsuo et al.

(10) Patent No.: US 12,702,041 B2
(45) Date of Patent: Aug. 4, 2026

(54) SEMICONDUCTOR DEVICE COMPRISING METALLIC FILM AND ANNULAR GROOVE PROVIDED ON THE BONDING SURFACE

(71) Applicants: Kabushiki Kaisha Toshiba, Tokyo (JP); Toshiba Electronic Devices & Storage Corporation, Tokyo (JP)

(72) Inventors: Kazuki Matsuo, Nonoichi Ishikawa (JP); Masatoshi Arai, Hakusan Ishikawa (JP); Rie Fujimoto, Komatsu Ishikawa (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 392 days.

(21) Appl. No.: 18/464,704

(22) Filed: Sep. 11, 2023

(65) Prior Publication Data

US 2024/0321808 A1     Sep. 26, 2024

(30) Foreign Application Priority Data

Mar. 22, 2023     (JP) ................................. 2023-044970

(51) Int. Cl.
   *H10W 72/30*        (2026.01)
   *H10W 72/00*        (2026.01)
   *H10W 90/00*        (2026.01)
(52) U.S. Cl.
   CPC ...... *H10W 72/30* (2026.01); *H10W 72/07352* (2026.01); *H10W 72/07353* (2026.01);
   (Continued)

(58) Field of Classification Search
   CPC . H01L 2224/32013; H01L 2224/32257; H01L 2224/32059; H01L 2224/33055;
   (Continued)

(56) References Cited

U.S. PATENT DOCUMENTS 6,287,950 B1 *  9/2001  Wu ......................... H01L 24/03
                                                    257/E21.508
2013/0009295 A1 *  1/2013  Otremba ............. H10W 70/481
                                                    257/676
(Continued)

FOREIGN PATENT DOCUMENTS

JP        2004-047800 A       2/2004
JP        2007134394 A        5/2007
(Continued)

OTHER PUBLICATIONS

Notice of Reasons for Refusal (Office Action) dated Mar. 17, 2026, mailed in counterpart Japanese Patent Application No. 2023-044970, with English machine translation, 12 pages.

*Primary Examiner* — Didarul A Mazumder
(74) *Attorney, Agent, or Firm* — Kim & Stewart LLP

(57)              ABSTRACT

A semiconductor chip according to an embodiment includes a metallic film provided on a semiconductor chip; an insulating film provided on the metallic film and having an opening; a bonding material provided on the metal film in the opening, and the bonding material being bonded to the metallic film; and a connector including a bonding surface bonded to the bonding material, and an annular groove provided on the bonding surface, the annular groove being along the periphery of the bonding surface, and an inner diameter of the annular groove being 60% or more and 90% or less of an outer diameter of the annular groove.

6 Claims, 4 Drawing Sheets

(52) U.S. Cl.
CPC ........ *H10W 72/321* (2026.01); *H10W 72/334*
(2026.01); *H10W 72/337* (2026.01); *H10W*
*90/736* (2026.01)

(58) Field of Classification Search
CPC ......... H01L 24/29; H01L 24/32; H01L 24/33;
H10W 72/321; H10W 72/30; H10W
72/337; H10W 72/07353; H10W
72/07352; H10W 72/334; H10W 90/736
USPC .......................... 257/734; 438/411, 461, 611
See application file for complete search history.

(56) References Cited

U.S. PATENT DOCUMENTS

| | | | |
|---|---|---|---|
| 2016/0133712 A1* | 5/2016 | Yoneda ................. | H10W 70/65 |
| | | | 257/774 |
| 2016/0225690 A1 | 8/2016 | Kadoguchi et al. | |
| 2020/0294925 A1* | 9/2020 | Yamada .............. | H10W 40/255 |
| 2022/0028761 A1* | 1/2022 | Yamada ................ | H10W 70/20 |
| 2023/0089603 A1* | 3/2023 | Koike .................... | H01L 24/40 |
| | | | 257/676 |
| 2023/0092204 A1* | 3/2023 | Matsuo .................. | H01L 24/30 |
| | | | 257/686 |

FOREIGN PATENT DOCUMENTS

| | | | |
|---|---|---|---|
| JP | 2008294172 A | | 12/2008 |
| JP | 2014236028 A | | 12/2014 |
| JP | 2015053343 A | | 3/2015 |
| JP | 2017-050441 A | | 3/2017 |
| WO | 2019/167218 A1 | | 9/2019 |
| WO | 2019244492 A1 | | 12/2019 |

* cited by examiner

SEMICONDUCTOR DEVICE COMPRISING METALLIC FILM AND ANNULAR GROOVE PROVIDED ON THE BONDING SURFACE

CROSS-REFERENCE TO RELATED APPLICATION

This application is based upon and claims the benefit of priority from Japanese Patent Application No. 2023-044970, filed on Mar. 22, 2023, the entire contents of which are incorporated herein by reference.

FIELD

Embodiments described herein relate generally to semiconductor device.

BACKGROUND

A semiconductor device having a semiconductor chip such as a metal oxide semiconductor field effect transistor (MOSFET) is used for applications such as power conversion. For example, when semiconductor device described above is a vertical MOSFET, a source electrode provided on an upper surface of a semiconductor chip is connected to a connector provided on MOSFET, for example.

DETAILED DESCRIPTION

Figure 1:
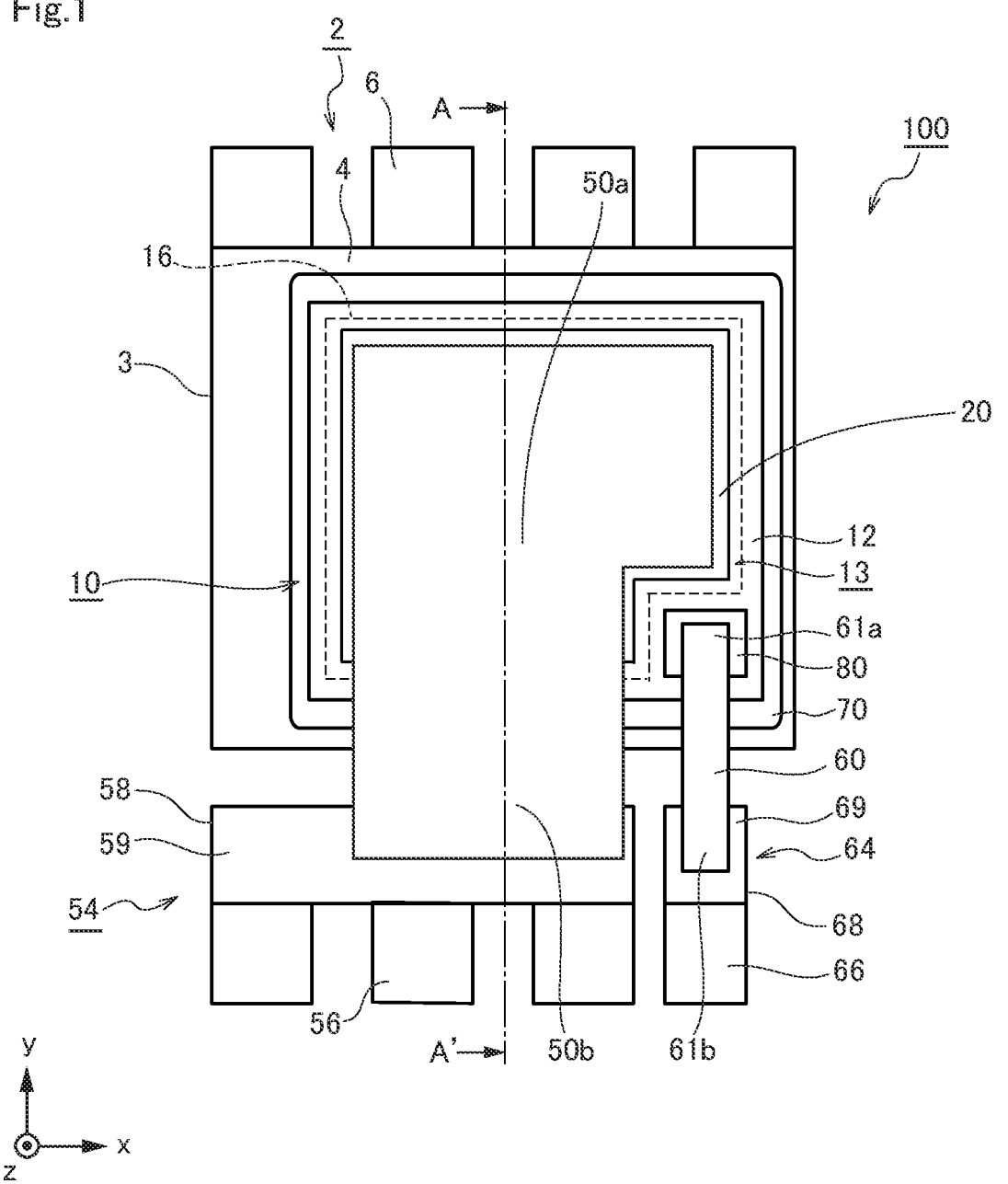
FIG. 1 is a schematic top view of a semiconductor device according to an embodiment.

Hereinafter, embodiments of the present disclosure will be described with reference to the drawings. Note that in the following description, the same members and the like are denoted by the same reference numerals, and description of members and the like once described is appropriately omitted.

In this specification, in order to illustrate the positional relationship of parts and the like, the upward direction of the drawings may be referred to as "upper", and the downward direction of the drawings may be referred to as "lower". Here, the terms "up" and "down" do not necessarily indicate a relationship with the direction of gravity.

Embodiment

A semiconductor device according to an embodiment includes a metallic film provided on a semiconductor chip: an insulating film provided on the metallic film and having an opening: a bonding material provided on the metal film in the opening, and the bonding material being bonded to the metallic film; and a connector including a bonding surface bonded to the bonding material, and an annular groove provided on the bonding surface, the annular groove being along the periphery of the bonding surface, and an inner diameter of the annular groove being 60% or more and 90% or less of an outer diameter of the annular groove.

Figure 2:
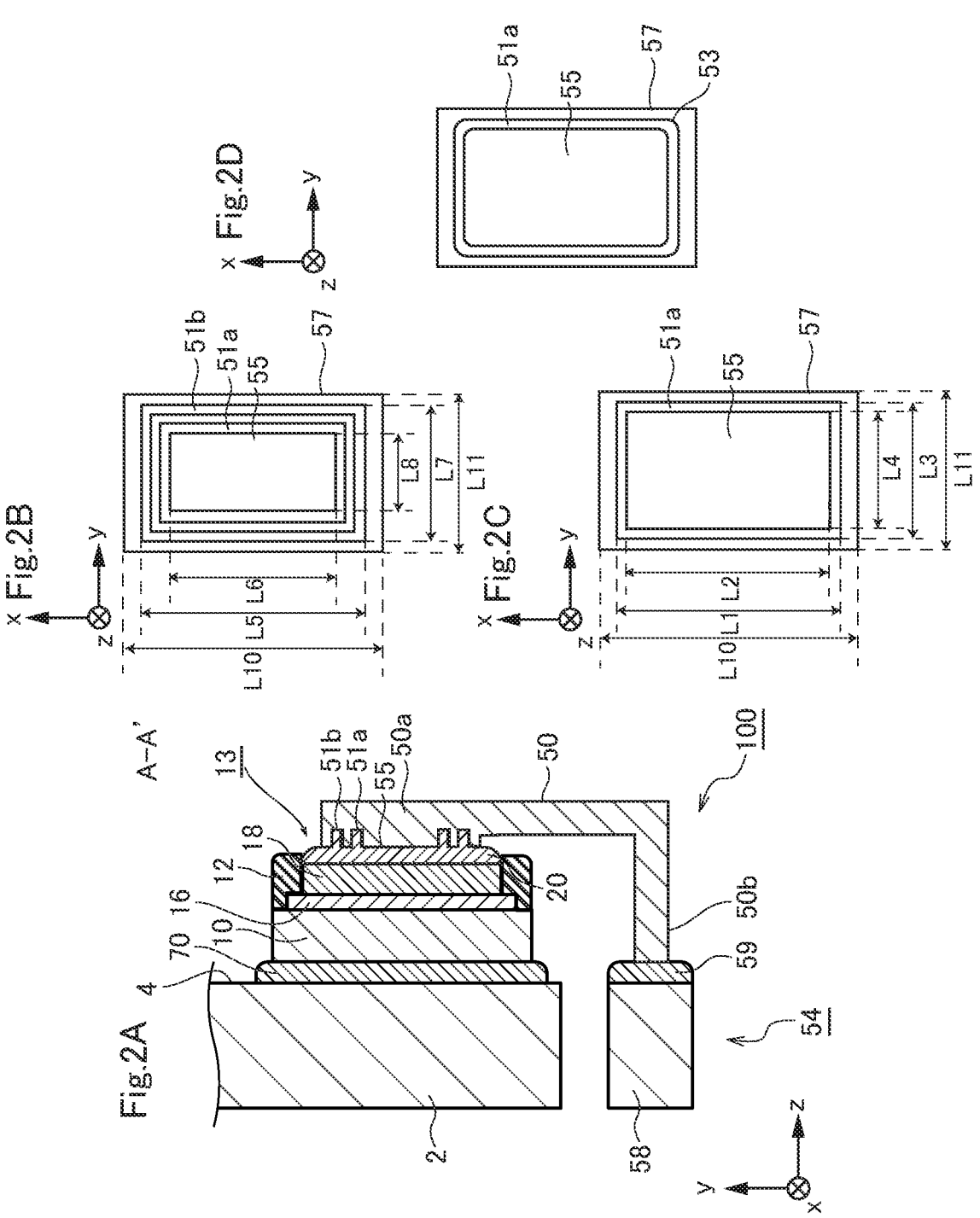
FIGS. 2A-2D are schematic cross-sectional views of a main part of the semiconductor device according to the embodiment.

FIG. 1 is a schematic top view of the semiconductor device 100 according to the embodiment. FIGS. 2A-D are schematic cross-sectional views of a main part of the semiconductor device 100 according to the embodiment. FIG. 2A is a schematic view of a cross section taken along line A-A' in FIG. 1. FIG. 2B is a schematic view of the bonding surface 55 of the embodiment. FIG. 2C is other schematic view of the bonding surface 55 of the embodiment. FIG. 2D is other schematic view of the bonding surface 55 of the embodiment.

The semiconductor device 100 of the embodiment will be described with reference to FIG. 1 and FIG. 2A-D.

A die pad 2 is a member including a conductive material such as Cu on which the semiconductor chip 10 is disposed. The die pad 2 includes a first bed 3 and a first outer lead 6. The first bed 3 has an upper surface 4. A semiconductor chip 10 is provided on the upper surface 4. The first outer lead 6 is connected to the first bed 3. The first outer lead 6 is used to connect the semiconductor chip 10 and an external circuit (not shown).

Here, an X direction, a Y direction perpendicular to the X direction, and a Z direction perpendicular to the X direction and the Y direction are defined. The upper surface 4 is arranged parallel to XY plane. The Y direction is an exemplary the first direction. The X direction is an exemplary the second direction.

The semiconductor chip 10 is provided on the upper surface 4 of the first bed 3. In the semiconductor chip 10, for example, a vertical diode, a MOSFET, or an IGBT (Insulated Gate Bipolar Transistor) is provided on the semiconductor substrate such as a Si (silicon) substrate, a SiC (silicon carbide) substrate, or a GaAs (gallium arsenide) substrate, etc. or a semiconductor layer of GaN (gallium nitride), etc. on the Si substrate.

The first bonding material 70 is provided between the upper surface 4 and the semiconductor chip 10. The first bonding material 70 joins the upper surface 4 and the semiconductor chip 10. For example, when the semiconductor chip 10 is provided with the MOSFET, the first bonding material 70 connects the drain electrode of the semiconductor chip 10 (not shown) and the upper surface 4.

The first metal film 16 is provided on the semiconductor chip 10. For example, if the semiconductor chip 10 is provided with the MOSFET, the first metal film 16 corresponds to the source electrode of such MOSFET. The first metal film 16 includes, for example, Al (aluminium).

The first insulating film 12 is provided on the first metal film 16. For example, the first insulating film 12 is provided on the edge of the semiconductor chip 10 and the edge of the first metal film 16. The first insulating film 12 has a first opening 13. The first opening 13 passes through the first insulating film 12. The first insulating film 12 includes, for example, silicon oxide formed from TEOS (Tetraethyl ortho-silicate) by plasma CVD (Chemical vapor deposition) or the insulating material such as polyimide.

The first insulating film 12 is an exemplary insulating film. The first opening 13 is an exemplary the opening.

The first post 54 includes a second bed 58 and a second outer lead 56. The first post 54 includes an electrically conductive material such as Cu. The second outer lead 56 is used for connecting the semiconductor chip 10 and an external circuit (not shown).

The second post 64 includes a third bed 68 and a third outer lead 66. The second post 64 includes an electrically conductive material such as Cu. The third outer lead 66 is used for connecting the semiconductor chip 10 and an external circuit (not shown).

The first connector (an exemplary connector) 50 includes a first end 50a and a second end 50b. The first end 50a has a bonding surface 55. The first connector 50 includes, for example, an electrically conductive material such as Cu. Incidentally, the surface of the first connector 50 may be plated by a material containing, for example, Tin (Sn). The first end 50a is provided on the first metal film 16 in the first opening 13. The second end 50b is provided on the second bed 58. For example, the first connector 50 is provided so as to extend in the Y direction stretching between the second bed 58 and the first bed 3 to which the second end 50b is connected.

The second metal film 18 is provided in the first opening 13 between the first end 50a of the first connector 50 and the first metal film 16. The second metal film 18 contains, for example, Ni and Au. The second metal film 18 is provided, for example, for increasing the bonding strength between the second bonding material 20 and the first metal film 16.

The first metal film 16 or the second metal film 18 is an exemplary metallic film.

A second bonding material 20 is provided on the second metal film 18. The second bonding material 20 is provided between the second metal film 18 and the bonding surface 55 of the first end 50a. The second bonding material 20 joins the bonding surface 55 of the first end 50a and the second metal film 18. The second bonding material 20 is an exemplary bonding material.

The bonding surface 55 includes an annular groove 51 along an outer periphery 57 of the bonding surface 55.

The bonding surface 55 is, for example, a plane. However, the bonding surface 55 does not have to be plane. For example, the bonding surface 55 may be subjected to a polishing treatment or the like for improving the biting property of the second bonding material 20.

In FIG. 2B, two annular grooves 51a and 51b are shown. The annular groove 51b is provided on the outer side of the annular groove 51a. The annular groove 51b and the annular groove 51a are provided concentrically with each other. A single annular groove 51a is shown in FIG. 2C. As described above, the bonding surface 55 may include a plurality of annular grooves 51 provided concentrically with each other. The number of annular grooves 51 is not particularly limited.

An inner diameter of the annular groove 51 in a predetermined direction parallel to the bonding surface 55 is 60% or more and 90% or less of an outer diameter of the annular groove 51 in the predetermined direction parallel to the bonding surface 55.

First, FIG. 2C including one annular groove 51a will be described. The inner diameter L2 of the annular groove 51a in the X direction is 60% or more and 90% or less of the outer diameter L1 of the annular groove 51a in the X direction. The inner diameter L4 of the annular groove 51a in the Y direction is 60% or more and 90% or less of the outer diameter L3 of the annular groove 51a in the Y direction. Here, it is assumed that bonding surface 55 is provided to be parallel to XY surface. The X direction or the Y direction is an exemplary predetermined direction parallel to the bonding surface 55.

Next, FIG. 2B including two annular grooves 51a and 51b will be described. The inner diameter L6 of the annular groove 51a provided on the inner side in the X direction is 60% or more and 90% or less of the outer diameter L5 of the annular groove 51b provided on the outer side in the X direction. The inner diameter L8 of the annular groove 51a provided on the inner side in the Y direction is 60% or more and 90% or less of the outer diameter L7 of the annular groove 51b provided on the outer side in the Y direction. Here again, it is assumed that the bonding surface 55 is provided to be parallel to XY plane. The X direction or the Y direction is an exemplary predetermined direction parallel to the bonding surface 55.

Similarly, when a plurality of annular grooves 51 are provided, the inner diameter of the annular groove 51 provided on the innermost side in the predetermined direction parallel to the bonding surface 55 is 60% or more and 90% or less of the outer diameter of the annular groove 51 provided on the outermost side in the predetermined direction parallel to the bonding surface 55.

In addition, it is preferable that an outer diameter of the annular groove 51 in the predetermined direction parallel to the bonding surface 55 is 90% or more and less than 100% of a length of the bonding surface 55 in the predetermined direction parallel to the bonding surface 55.

First, FIG. 2C including one annular groove 51a will be described. It is preferable that the outer diameter L1 of the annular groove 51a in the X direction is 90% or more and less than 100% of the length L10 of the bonding surface 55 in the X direction. In addition, it is preferable that the outer diameter L3 of the annular groove 51a in the Y direction is 90% or more and less than 100% of the length L11 of the bonding surface 55 in the X direction.

Next, FIG. 2B including two annular grooves 51a and 51b will be described. It is preferable that the outer diameter L5 of the annular groove 51b provided on the outer side in the X direction is 90% or more and less than 100% of the length L10 of the bonding surface 55 in the X direction. It is preferable that the outer diameter L7 of the annular groove 51b provided on the outer side in the Y direction is 90% or more and less than 100% of the length L11 of the bonding surface 55 in the Y direction.

Similarly, when a plurality of annular grooves 51 are provided, the outer diameter of the annular groove 51 provided on the outermost side in the predetermined direction parallel to the bonding surface 55 is preferably 90% or more and less than 100% of the length of the bonding surface 55 in the predetermined direction parallel to the bonding surface 55.

For example, as shown in FIGS. 2B-D, the annular groove 51 is formed in a rectangular shape along the outer periphery 57 of the bonding surface 55 with respect to the bonding surface 55 having a rectangular shape. However, the shape of the annular groove 51 is not limited thereto.

Further, as shown in FIG. 2D, the corners 53 of the annular groove 51 having a rectangular shape may be chamfered.

A third bonding material 59 is provided between the second bed 58 and the second end 50b. The third bonding material 59 joins the second bed 58 and the second end 50b.

The second connector 60 has a third end 61a and a fourth end 61b. The second connector 60 includes, for example, an electrically conductive material such as Cu. Incidentally, the surface of the second connector 60 may be plated by a material containing, for example, Sn. The third end 61a is electrically connected to the semiconductor chip 10 via a fourth bonding material 80 provided on the semiconductor chip 10. Underneath the fourth bonding material 80, for example, a gate electrode pad of the semiconductor chip 10 (not shown) is provided. The gate electrode pad is connected to the gate electrode of the semiconductor chip 10.

A fifth bonding material 69 is provided between the third bed 68 and the fourth end 61*b*. The fifth bonding material 69 joins the third bed 68 and the fourth end 61*b*.

As the first bonding material 70, the second bonding material 20, the third bonding material 59, the fourth bonding material 80, and the fifth bonding material 69, for example, solder containing Pb (lead) and Sn (tin), solder containing Pb, Ag (silver), and Sn (tin), solder containing Sn and Sb (antimony), solder containing Au (gold) and Sn, solder containing Au and Si, or solder containing Au and Ge (germanium) can be preferably used.

The film thickness of the first metal film 16 is not particularly limited, but is, for example, about 4 μm. The film thickness of the second metal film 18 is not particularly limited, but is, for example, about 3 μm. The film thickness of the first insulating film 12 is not particularly limited, but is, for example, about 5 μm. The depth of the annular groove 51 is not particularly limited, but is, for example, about several μm. The film thickness of the first metal film 16, the film thickness of the second metal film 18 and the film thickness of the first insulating film 12 is not limited to those described above.

Figure 3:
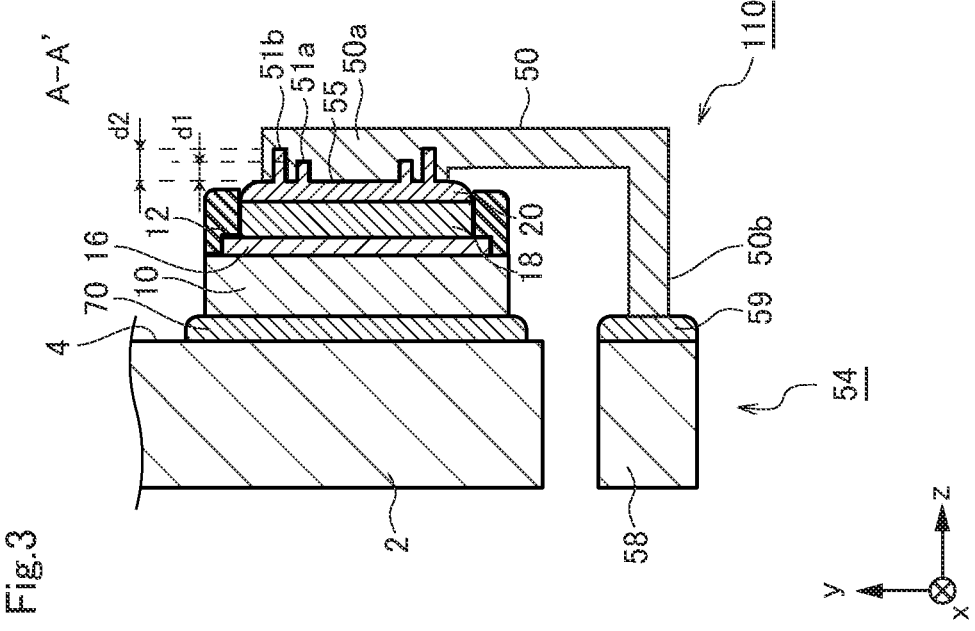
FIG. 3 is another schematic view of a bonding surface of the semiconductor device according to the embodiment.

FIG. 3 is another exemplary schematic cross-sectional view of the semiconductor device 110 according to the embodiment. The depth d2 of the annular groove 51*b* provided on the outer side is preferably deeper than the depth d1 of the annular groove 51*a* provided on the inner side.

Next, the operation and advantages of the semiconductor device of the present embodiment will be described.

When the semiconductor device 100 was manufactured, the second bonding material 20 sometimes spread to the edge of the semiconductor chip 10 and remained on the first insulating film 12. Due to the remaining bonding material, poor properties and poor reliability of the semiconductor device may occur.

Figure 4B:
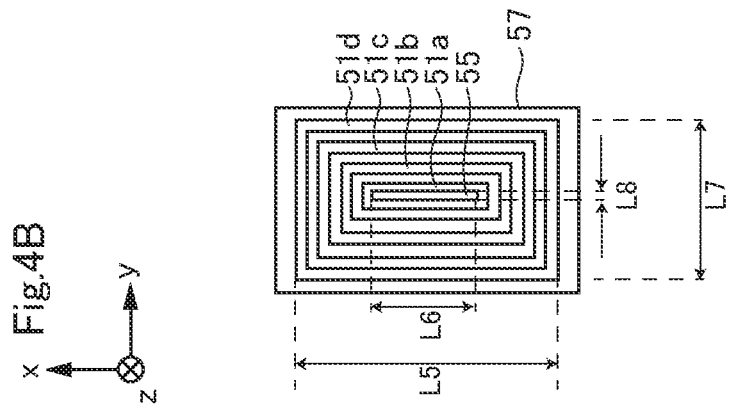
FIGS. 4A-4B are schematic views of a main part of the semiconductor device according to a comparative embodiment.
Figure 4A:
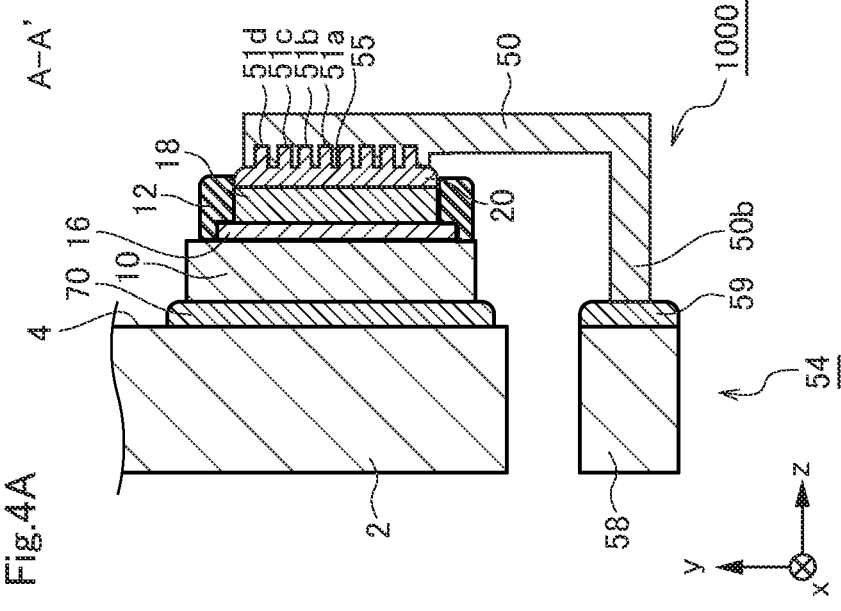

FIGS. 4A-B are schematic cross-sectional views of a semiconductor device 1000 according to a comparative embodiment. The annular grooves 51 are formed on the entire surface of the bonding surface 55. In the X direction, the inner diameter L6 of the innermost annular groove 51*a* is less than 60% of the outer diameter L5 of the outermost annular groove 51*d*. In the Y direction, the inner diameter L8 of the innermost annular groove 51*a* is less than 60% of the outer diameter L7 of the outermost annular groove 51*d*.

By providing annular grooves 51 on the entire surface of the bonding surface 55 and increasing the area that the second bonding material 20 contacts, it is possible to prevent the second bonding material 20 from remaining on the first insulating film 12. However, when a plurality of annular grooves 51 are provided on the inner side, the annular groove 51 provided on the inner side tends to form a cavity without filling the second bonding material 20. Therefore, the contact resistance between the bonding surface 55 and the first metal film 16 may be increased. As a result, the on-resistance of the semiconductor device may be increased.

Therefore, according to the semiconductor device of the present embodiment, the inner diameter of the annular groove 51 is 60% or more and 90% or less of the outer diameter of the annular groove 51. As a result, it is possible for the second bonding material 20 to spread sufficiently within the first opening 13 of the first insulating film 12 and it is possible to prevent the second bonding material 20 from remaining on the first insulating film 12.

The annular groove 51 is preferably formed in a rectangular shape with respect to the bonding surface 55. Often, the semiconductor chip 10 is rectangular in shape. Therefore, by forming the annular groove 51 in accordance with the configuration of the semiconductor chip 10, the spread of the second bonding material 20 in the first opening 13 can be easily controlled. Further, the corners of the rectangular shape of the annular groove 51 are easier to form when chamfered.

The bonding surface 55 may include a plurality of annular grooves 51. This is because, by appropriately controlling the numbers of annular grooves 51, it is easy for the second bonding material 20 to spread sufficiently within the first opening 13 of the first insulating film 12 and it is possible to prevent the second bonding material 20 from remaining on the first insulating film 12.

When the bonding surface 55 has a plurality of annular grooves 51, the inner diameter of the annular groove 51 provided on the innermost side is preferably 60% or more and 90% or less of the outer diameter of the annular groove provided on the outermost side. This is because it is possible for the second bonding material 20 to spread sufficiently within the first opening 13 of the first insulating film 12 and it is possible to prevent the second bonding material 20 from remaining on the first insulating film 12.

When the bonding surface 55 has a plurality of annular grooves 51, the depth of the annular groove 51 provided on the outer side is preferably deeper than the depth of the annular groove 51 provided on the inner side. This is because when the inner annular groove 51 is deepened, the second bonding material 20 is hardly sufficiently spread in the first opening 13.

The outer diameter of the annular groove 51 is preferably 90% or more and less than 100% of the length of the bonding surface 55. Consider the case where the outer diameter of the annular groove 51 is less than 90% and the quantity of the second bonding material 20 located in the vicinity of the first insulating film 12 is too large. In this case the second bonding material 20 does not enter the annular groove 51, but tends to protrude on the first insulating film 12. By setting the outer diameter of the annular groove 51 to be 90% or more and less than 100% of the length of the bonding surface 55, this can be suppressed.

According to the semiconductor device of the present embodiment, a highly reliable semiconductor device can be provided.

While certain embodiments have been described, these embodiments have been presented by way of example only, and are not intended to limit the scope of the inventions. Indeed, the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
a metallic film provided on a semiconductor chip;
an insulating film provided on the metallic film and having an opening;
a bonding material provided on the metallic film in the opening, and the bonding material being bonded to the metallic film; and
a connector including
a bonding surface bonded to the bonding material, and
an annular groove provided on the bonding surface, the annular groove being along a periphery of the bonding surface, and an inner diameter of the annular groove being 60% or more and 90% or less of an outer diameter of the annular groove, wherein the connector further includes a plurality of annular grooves provided concentrically with each other, and wherein a depth of the annular groove provided on the outer side is deeper than a depth of the annular groove provided on the inner side.

2. The semiconductor device according to claim 1, wherein the bonding surface has a rectangular shape, and the annular groove is formed in the rectangular shape with respect to the bonding surface.

3. The semiconductor device according to claim 2, wherein a corner of the annular groove is chamfered.

4. The semiconductor device according to claim 1, wherein the outer diameter of the annular groove in a predetermined direction parallel to the bonding surface is 90% or more and less than 100% of a length of the bonding surface in the predetermined direction parallel to the bonding surface.

5. The semiconductor device according to claim 1, wherein the inner diameter of the annular groove provided on the innermost side in the predetermined direction parallel to the bonding surface is 60% or more and 90% or less of an outer diameter of the annular groove provided on the outermost side in the predetermined direction parallel to the bonding surface.

6. The semiconductor device according to claim 1, wherein an outer diameter of the annular groove provided on the outermost side in the predetermined direction parallel to the bonding surface is 90% or more and less than 100% of the length of the bonding surface in the predetermined direction parallel to the bonding surface.

* * * * *